US006346856B1

(12) United States Patent
Myers et al.

(10) Patent No.: US 6,346,856 B1
(45) Date of Patent: Feb. 12, 2002

(54) ULTRA LINEAR HIGH FREQUENCY TRANSCONDUCTOR STRUCTURE

(75) Inventors: Brent A. Myers, Palm Bay, FL (US); Ramkishore Ganti, Waltham, MA (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/571,822

(22) Filed: May 16, 2000

(51) Int. Cl.$^7$ ................................................ H03F 3/45
(52) U.S. Cl. ...................................... 330/252; 330/258
(58) Field of Search ............................... 330/252, 258, 330/300, 303, 305

(56) References Cited

U.S. PATENT DOCUMENTS 5,392,003 A * 2/1995 Nag et al. ................ 330/258 X
5,436,594 A * 7/1995 Pace et al. .................... 330/258
5,736,899 A * 4/1998 Bowers et al. ............... 330/252

OTHER PUBLICATIONS

Galvez–Durand et al., A Wide Range Compensated OTA for Balanced Filters IEEE Proc. 37th Midwest Symp. on Circuits & Systems, vol. 2, 1994, pp. 1123–1126.*
U. Moon, et al., "Design of Low–Distortion 22–kHz Fifth–Order Bessel Filter", *IEEE Journal of Solid–State Circuits*, vol. 28, No. 12, Dec. 1993, pp. 1254–1264.
Roberto Alini, et al., "Tunable BiCMOS Continuous–Time Filter for High–Frequency Applications", *IEEE Journal of Solid–State Circuits*, vol. 27, No. 12, Dec. 1992, pp. 1905–1915.
José Silva–Martinez, et al. "A Large–Signal Very Low–Distortion Transconductor for High–Frequency Continuous–Time Filters", *IEEE Journal of Solid–State Circuits*, vol. 26, No. 7, Jul. 1991, pp. 946–955.

Yannis P. Tsivids, "Integrated Continuous–Time Filter Design—An Overview", *IEEE Journal of Solid–State Circuits*, vol. 29, No. 3, Mar. 1994, pp. 166–176.
Scott D. Willingham, "A BiCMOS Low–Distortion 8–MHz Low–Pass Filter" *IEEE Journal of Solid–State Circuits*, vol. 28, No. 12, Dec. 1993, pp. 1234–1245.

* cited by examiner

*Primary Examiner*—Steven J. Mottola
(74) *Attorney, Agent, or Firm*—Gary R. Stanford

(57) ABSTRACT

A transconductor block including a Czarnul tuning network, transconductance resistors, an input voltage follower amplifier, a common mode circuit, PMOS transistors coupled in cascode configuration, an input current source, and high gain amplifiers that drive NMOS transistors at the output. The input voltage follower amplifier receives a differential input signal including a common mode voltage and applies the differential input signal to the Czarnul tuning network. The Czarnul tuning network includes series resistors and is coupled in parallel with the transconductance resistors. The common mode circuit receives the differential input signal and a reference common mode voltage and provides a bias voltage and a common mode feedback voltage. The common mode circuit asserts the common mode feedback voltage to the output PMOS transistors to establish a DC output current and to minimize drift of the common mode voltage of the transconductance block. Also, the bias voltage is level shifted from the common mode signal. The high gain amplifiers maintain the output of the Czarnul tuning network and transconductance resistors at the bias voltage. The high gain amplifiers are coupled to the input current sources and to the NMOS transistors in a negative feedback configuration. The high gain amplifiers drive the NMOS transistors to reflect an output current that corresponds to the input voltage signal.

32 Claims, 5 Drawing Sheets

ULTRA LINEAR HIGH FREQUENCY TRANSCONDUCTOR STRUCTURE

FIELD OF THE INVENTION

The present invention relates to communications, and more particularly to an ultra linear high frequency transconductor for use in communication networks.

DESCRIPTION OF RELATED ART

Linearity is of utmost importance in the present day communication networks. In all wireless and wireline systems, it is very important to have low inter-channel interference and crosstalk. For example, in wireless networks it is important to maximize linearity in a channel to facilitate adapting to significant multipath propagation distortion. Linearization permits digital equalization techniques to resolve the multipath distortion.

Filters are a key component in any data communication system, providing anti-alias support, channel tuning, and channel matching. Since filters are in the communication path, filter linearity is crucial. There is strong motivation to realize filters on monolithic integrated circuits to reduce external component count, and hence, to reduce the cost for the overall communication system. There is also strong motivation to minimize power consumption since many communication applications are portable, such as cell phones, pagers, personal digital assistants (PDAs), etc. Filter techniques have achieved high linearity, but at the expense of high power, or alternatively, low power at the expense of poor linearity. More power efficient techniques are required.

SUMMARY OF THE INVENTION

A transconductor including a tunable transconductive device, a first amplifier circuit receiving a differential input signal, a common mode circuit, an input current source, first and second output current sources, and a second amplifier circuit that provides a differential output current based on the differential input signal. The differential input signal includes an input signal combined with a common mode signal. The first amplifier circuit applies the differential input signal to a differential input of the tunable transconductive device. The common mode circuit receives the differential input signal and a reference common mode signal, and provides a bias signal and a common mode feedback signal. The input current source is coupled to a two port output of the tunable transconductive device and sinks a constant input bias current. The output current sources are each coupled to the common mode circuit and provide output bias currents adjusted by the common mode feedback signal. The second amplifier circuit is coupled to the common mode circuit, the input current source, the tunable transconductive device and the output current sources, and maintains the two port output of the tunable transconductive device at a level of the bias signal and provides a differential output current based on the differential input signal. The transconductor may further be coupled to output capacitors to provide an output voltage that is proportional to the integral of the input signal.

In one embodiment, the tunable transconductive device includes first and second transconductive resistors and a tuning circuit in parallel with the first and second transconductive resistors. The tuning circuit has an adjust input for receiving an adjust signal. In a more particular embodiment, the tuning circuit comprises a Czarnul tuning circuit and series resistors. The series resistors are each coupled in series with a respective differential input of the Czarnul tuning circuit, where the series resistors and the Czarnul tuning circuit are coupled in parallel with the first and second transconductive resistors.

The first amplifier circuit may include first and second operational amplifiers, each including a non-inverting input that receives the common mode input signal, an inverting input and an output. The first amplifier circuit further includes first and second bipolar transistors, each having a collector coupled to a supply voltage, an emitter coupled to an inverting input of a respective one of the operational amplifiers, and a base coupled to an output of a respective one of the operational amplifiers.

The common mode circuit may include an input stage, a bias signal stage, and a differential amplifier stage. In one embodiment, the input stage includes a balanced Resistor-Capacitor (RC) circuit that receives the differential input signal and that derives the common mode signal. The differential amplifier stage receives the common mode signal from the input stage and the reference common mode signal and provides the common mode feedback signal. The bias signal stage receives the common mode signal from the input stage and generates the bias signal based on the common mode signal. The bias signal stage may further include a bias resistor receiving the common mode signal on one side and providing the bias signal on its other side, and first and second bias current sources coupled on either side of the bias resistor. Furthermore, the first and second bias current sources may each include a bandgap voltage source providing a precise control voltage, and a second bias resistor.

The first and second output current sources may each comprise MOSFETs coupled in a cascode configuration and operating in saturation. In a more particular embodiment, the MOSFETs are PMOS transistors, where a PMOS transistor at each differential output receives the common mode feedback signal from the common mode circuit. In this manner, the common mode circuit asserts the common mode feedback signal to minimize drift of the common mode signal of the circuit from the reference common mode signal.

In one embodiment, the second amplifier circuit includes first and second high gain amplifiers, each having a first input receiving the bias signal and a second input coupled to a respective output port of the tunable transconductive device. The second amplifier circuit may further include first and second current control devices, each having a current control path coupled to a respective one of the first and second output current sources and a control input coupled to an output of a respective one of the high gain amplifiers. In a more particular embodiment, the high gain amplifiers are operational amplifiers, each including an inverting input coupled to a respective output port of the tunable transconductive device and a non-inverting input that receives the bias signal. Also, the current control devices are MOSFETs, each having a current path coupled between a respective one of the output current sources and to an inverting input of a respective one of the operational amplifiers. In one embodiment, the operational amplifiers keep the output of a Czarnul tuning circuit at the level of the bias signal provided from the common mode circuit.

In an alternative embodiment, the transconductor includes a tunable resistive device, a voltage follower amplifier, a common mode circuit, an input current source, an output current source, a variable current source, and a high gain amplifier. The voltage follower amplifier receives a common mode input signal including an input signal combined with a common mode voltage, and provides the common mode input signal to the input of the tunable resistive device. The common mode circuit receives a reference common mode voltage and the common mode input signal and generates a bias voltage and a common mode feedback voltage. The input current source sinks a constant bias current from the tunable resistive device. The output current source receives the common mode feedback voltage and provides a DC output current based on the common mode feedback voltage The variable current source is coupled to the output current source and sinks current based on a control input. The high gain amplifier maintains the output of the resistive device at the bias voltage and controls the variable current source to sink output current based on the input signal.

The tunable resistive device may comprise a Czarnul tuning circuit and series resistors coupled in parallel with a transconductance resistor. The voltage follower amplifier may include an operational amplifier and a bipolar transistor coupled with negative feedback to assert the common mode input signal to the input of the tunable resistive device. The common mode circuit may include an input stage, a bias voltage stage, and a differential amplifier stage. The input stage may include a balanced RC circuit that receives the common mode input signal and that provides the common mode voltage. The differential amplifier stage receives the common mode voltage from the input stage and the reference common mode voltage and provides the common mode feedback signal. The bias voltage stage includes a bias resistor coupled between constant current sources, receives the common mode voltage on one side and provides the bias voltage on its other side. The output current source may include PMOS transistors coupled in cascode configuration and operating in saturation. The variable current source may comprise an NMOS transistor controlled by the high gain amplifier. The high gain amplifier may comprise an operational amplifier including an inverting input coupled to output of the tunable resistive device, a non-inverting input that receives the bias voltage and an output that drives the NMOS transistor to sink a current based on the input signal.

A filter circuit according to an embodiment of the present invention includes one or more common mode circuits, a plurality of inter-coupled transconductors, and a reference circuit that provides a reference common mode signal and an adjust input voltage for a tunable transconductive device of each transconductor. Each common mode circuit receives a differential input signal having a common mode signal and receives a reference common mode signal, and each provides a bias signal and a common mode feedback signal. The transconductors are each associated with one of the common mode circuits and each are configured in a similar manner as described above.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE EMBODIMENT(S) OF THE INVENTION

Figure 1:
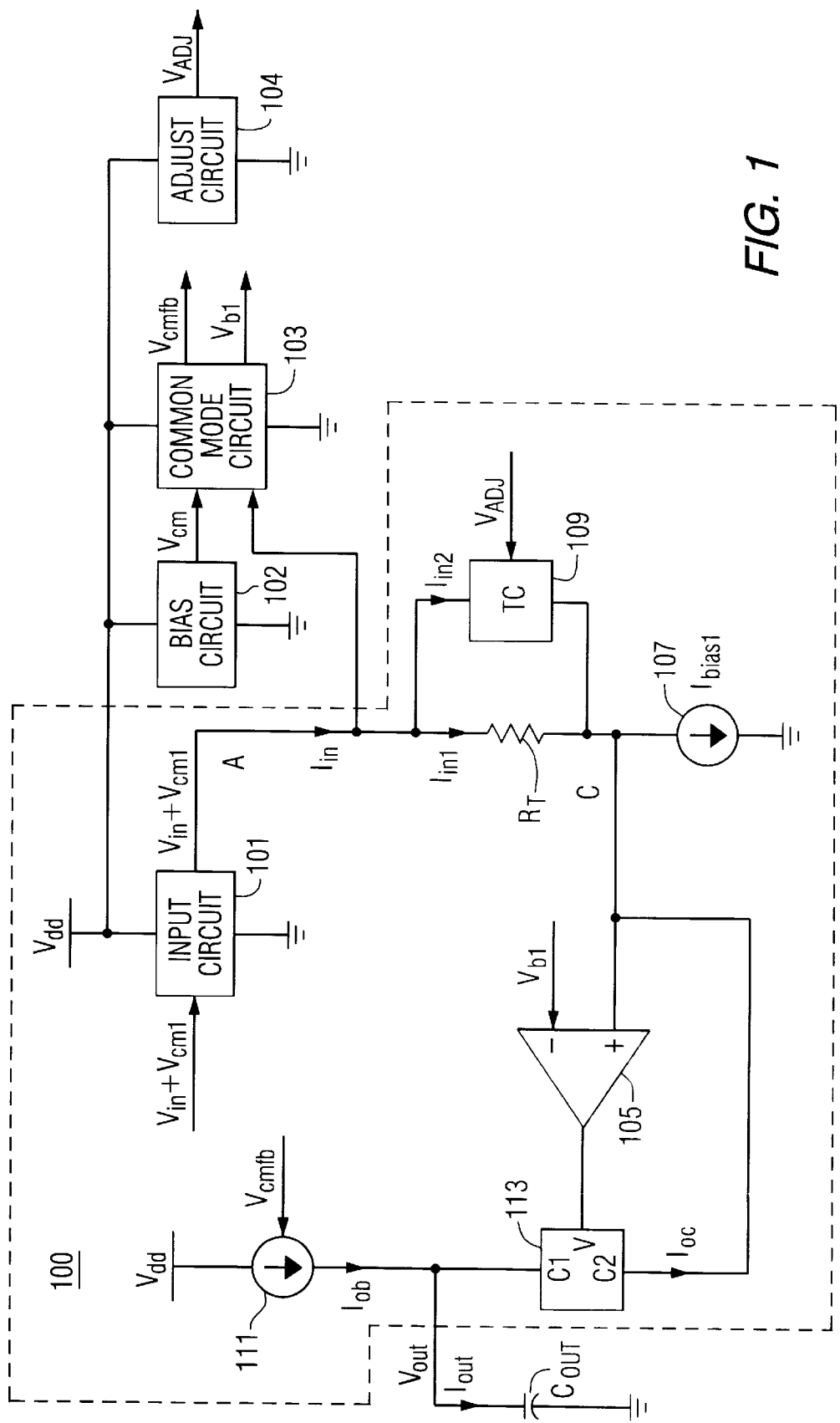
FIG. 1 is a block diagram of a simplified transconductor block with a capacitive load that is used to illustrate operation of a transconductor according to the present invention.

FIG. 1 is a block diagram of a simplified transconductor block 100 with capacitive load $C_{OUT}$ that is used to illustrate operation of a transconductor according to the present invention. The transconductor block 100 illustrates one side of a transconductor circuit, which typically receives a differential input and provides a differential output. As described further below, the transconductor block 100 may be used as a building block in which it is combined with other, similar transconductor circuits to implement amplifiers, filters, etc., as known to those skilled in the art. The transconductor block 100 is associated with and coupled to a bias circuit 102, a common mode feedback circuit (CMFB) 103 and an adjust circuit 104. The bias circuit 102, the CMFB 103 and the adjust circuit 104 may each be provided locally or globally in which each is associated with one or more transconductor blocks.

A power supply voltage, referred to as $V_{dd}$, is provided to an input circuit 101 of the transconductor block 100, to the bias circuit 102, to the CMFB 103 and to the adjust circuit 104, where each are referenced to ground. The input circuit 101 receives a common mode input signal including an input signal $V_{in}$ combined with a common mode signal $V_{cm1}$ ($V_{in}+V_{cm1}$) and asserts a buffered version of $V_{in}+V_{cm1}$, at an output node A. In this manner, the input circuit 101 operates as a voltage follower amplifier. The bias circuit 102 provides a reference common mode voltage or signal $V_{cm}$ and a reference bias voltage or signal $V_{b2}$ to the CMFB 103. The CMFB 103 receives the buffered input signal $V_{in}+V_{cm1}$, the $V_{cm}$ signal and the $Vb_{b2}$ signal and generates an output stage common mode feedback signal $V_{cmfb}$ and an input stage bias signal $V_{b1}$. The adjust circuit 104 develops an adjustable voltage $V_{ADJ}$.

A resistor $R_T$ is provided as the primary transconductance resistor for the transconductor block 100. The resistor $R_T$ has one terminal coupled to the node A and its other terminal coupled to a node C, which is also coupled to the inverting input of a high gain amplifier 105, such as an operational amplifier. A non-inverting input of the amplifier 105 receives the $V_{b1}$ signal. An input current source 107 has its input coupled to node C and its output coupled to ground, and sinks a constant current of $I_{bias1}$ between node C and ground. A tuning circuit (TC) 109 receives the adjust signal $V_{ADJ}$ and has its input terminal coupled to node A and its output terminal coupled to node C in parallel with the transconductance resistor $R_T$. In this manner, the TC 109 and the transconductance resistor $R_T$ form a tunable resistive device that is adjustable or tunable via the adjust signal $V_{ADJ}$. The input current $I_{in}$ flows out of the input circuit 101 and splits between a current $I_{in1}$, through the resistor $R_T$ and a current $I_{in2}$ through the TC 109.

In the output stage, the supply voltage $V_{dd}$ is provided to the input terminal of an adjustable output current source 111, which has its output terminal coupled to one terminal of an output capacitor $C_{OUT}$ and to a current terminal of a voltage controlled or otherwise variable current source or current device 113. The other terminal of the capacitor $C_{OUT}$ is coupled to ground. The capacitor $C_{OUT}$ converts the transconductor block 100 into an integrator. The current source 111 has a control input that receives the $V_{cmfb}$ signal. The other current terminal of the current device 113 is provided to the inverting input of the amplifier 105, which has its output coupled to the voltage control input of the current device 113. The current source 111 provides an output bias current $I_{ob}$ that is adjustable by the voltage level of the common mode feedback signal $V_{cmfb}$. The junction between the current source 111 and the current sink 113 is an output voltage, $V_{out}$. The current into the capacitor $C_{OUT}$ is the output current $I_{out}$ and the current through the current device 113 is a current $I_{oc}$.

The bias circuit 102 sets the desired common mode voltage $V_{cm}$ for the transconductor block 100. The CMFB 103 is a feedback circuit that adjusts the $V_{cmfb}$ signal to ultimately control the $V_{cm1}$ signal to minimize any difference between the $V_{cm1}$ and $V_{cm}$ signals. The input circuit 101 operates as a buffer or voltage follower amplifier to maintain the DC voltage of node A at the common mode voltage $V_{cm1}$, and to vary the voltage at node A by the AC input voltage $V_{in}$. The amplifier 105 maintains node C at a fixed voltage of $V_{b1}$. The current source 107 provides current biasing for the transconductor block 100 so that the input voltage $V_{in}$ is reflected as the output current $I_{out}$. In particular, since $I_{bias1}$ is fixed, the current $I_{oc}$ varies with the input current $I_{oc}=I_{bias1}-(I_{in1}+I_{in2})$. Also, since the output bias current $L_b$ is effectively constant (adjusted by $V_{cmfb}$), the output current $I_{out}$ varies with $I_{oc}$, where $I_{out}=I_{ob}-I_{oc}$. Since $V_{b1}$ is fixed, the input current $I_{in}=I_{in1}+I_{in2}$ is dependent on the absolute value of the resistor $R_T$, the TC 109 and the voltage level of $V_{cm1}$. In order to have a stable biasing point, the $V_{b1}$ signal is made a level shifted copy of the common mode voltage $V_{cm1}$. This is achieved by a tight common mode control loop, which further ensures that the transconductor block 100 has stable DC biasing.

The resistor $R_T$ is the main transconductance setting element and roughly determines the overall transconductance characteristic of the transconductor block 100. The quiescent point is subject to change, however, because of manufacturing variations and common mode fluctuations. The adjust circuit 104 enables the $V_{ADJ}$ signal to be adjusted to tune the TC 109 to more precisely define the primary transconductance characteristic. The tuning circuit 109, therefore, is used to compensate for the manufacturing variations to more precisely define the transconductance.

In operation, the input AC signal $V_{in}$ is applied to the parallel combination of the resistor $R_T$ and the tuning circuit TC 109. The resistor $R_T$ and the TC 109 convert the AC input voltage $V_{in}$ to an AC current $I_{in}$. Since the current source 107 sinks a constant current $I_{bias1}$, varying input current due to the input voltage $V_{in}$ in flows into the output leg of the circuit. In particular, the amplifier 105 controls the current device 113 to sink an output current that is based on the input current $I_{in}$. Since the current source 111 sources a generally constant current $I_{ob}$, the varying output current $I_{out}$ flows through the integration capacitor $C_{OUT}$ to develop the output voltage $V_{out}$. In this manner, an integrator is realized. Although the transconductor block 100 illustrates the general principles of operation, a practical transconductor is operated in differential mode. Also, the use of the TC 109 and the CMFB 103 helps to establish the desired stability and linearity.

Figure 2:
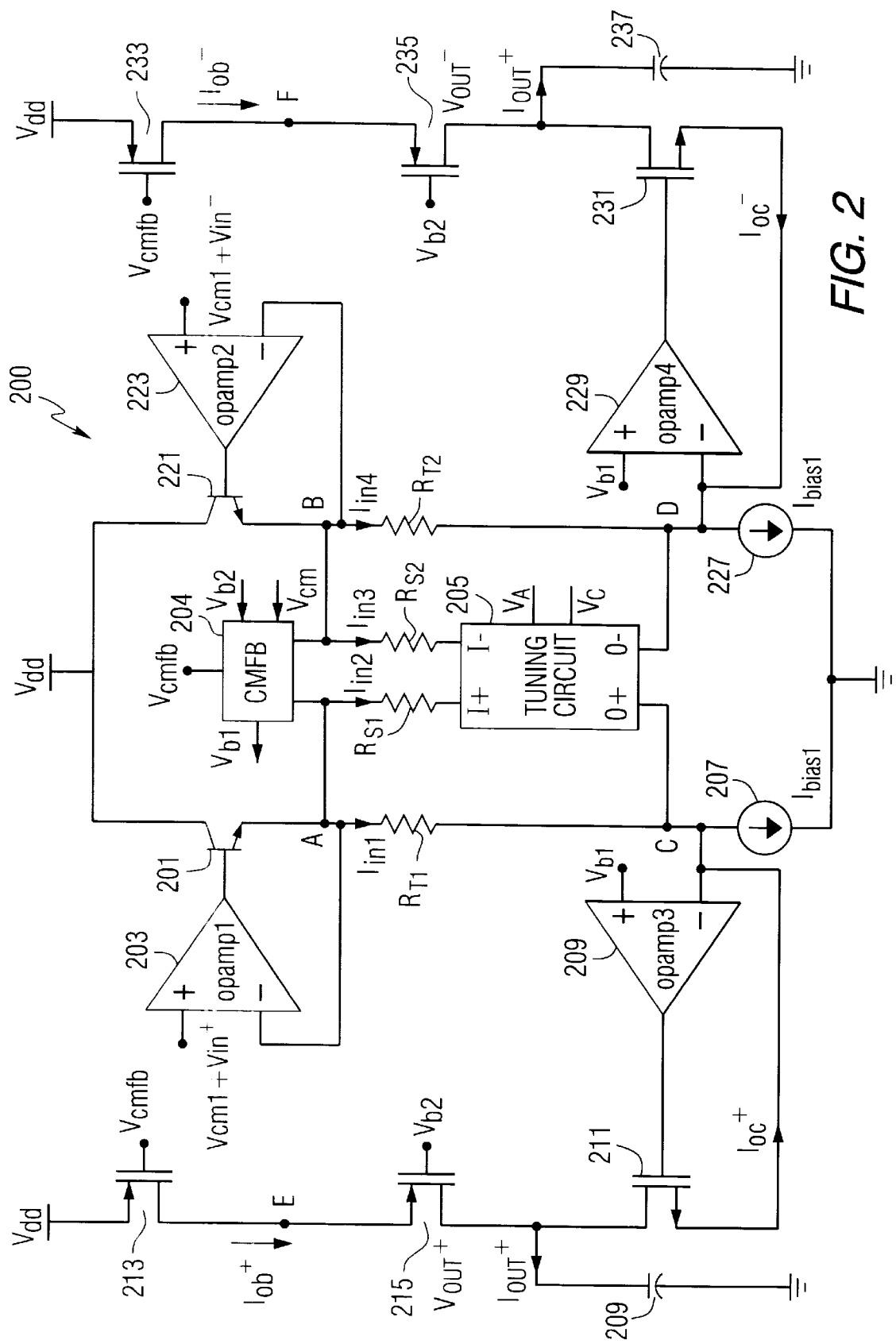
FIG. 2 is a block diagram of a transconductor block implemented according to a differential embodiment of the present invention.

FIG. 2 is a block diagram of a transconductor block 200 implemented according to a differential embodiment of the present invention. In a similar manner described above for the transconductor block 100, the transconductor block 200 is associated with a bias circuit similar to the bias circuit 102 and an adjust circuit similar to the adjust circuit 104. The transconductor block 200 is shown including a common mode feedback circuit (CMFB) 204, which may be specific to the transconductor block 200 or which may provide common mode feedback to multiple transconductor blocks depending upon particular design considerations.

For the positive side, the supply voltage $V_{dd}$ is provided to the collector terminal of a bipolar transistor 201, which has its emitter terminal coupled to the inverting input terminal of an operational amplifier (opamp) 203. The non-inverting input terminal of the opamp 203 receives a common mode input voltage signal $V_{cm1}+V_{in}^+$ (the positive common mode input signal), and the output terminal of the opamp 203 drives the base terminal of the transistor 201. The emitter terminal of the transistor 201, referred to as node A, is coupled to a positive input terminal of the CMFB 204. The CMFB 204 receives the bias signal $V_2$ and the reference common mode signal $V_{cm}$, and provides the common mode feedback signal $V_{cmfb}$ and the bias signal $V_{b1}$.

Node A is coupled to one terminal of a first transconductor resistor $R_{T1}$ and to one terminal of a first series resistor $R_{S1}$. The other terminal of the resistor $R_{S1}$ is provided to a positive input terminal (I+) of a differential tuning circuit 205. The other terminal of the resistor $R_{T1}$ is coupled to a positive output port or terminal (O+) of the tuning circuit 205, which is referred to as node C. The tuning circuit 205 receives two input adjust voltages $V_A$ and $V_C$, where the adjust voltage is the applied voltage difference or $V_A-V_C$. Node C is also coupled to an input terminal of a current source 207, which has its output terminal coupled to ground. The current source 207 sinks a constant current of $I_{bias1}$Node C is further coupled to an inverting input terminal of an opamp 209, which receives the bias voltage $V_{b1}$ at its non-inverting input terminal. The output terminal of the opamp 209 is coupled to the gate of an N-channel Metal Oxide Semiconductor Field Effect Transistor (MOSFET) (NMOS transistor) 211, which has its source terminal coupled to node C.

The source voltage $V_{dd}$ is coupled to the source terminal of a p-channel MOSFET PMOS transistor) 213, which receives the $V_{cmfb}$ signal at its gate terminal. The drain terminal of the PMOS transistor 213, referred to as node E, is coupled to the source terminal of another PMOS transistor 215, which receives the bias voltage $V_{b2}$ at its gate terminal. The drain terminal of the PMOS transistor 215 is coupled to the positive terminal of an output capacitor 217 and to the drain terminal of the NMOS transistor 211. The negative terminal of the capacitor 217 is coupled to ground. The positive terminal of the capacitor 217 is the positive output terminal $V_{out}^+$ of the transconductor block 200. A positive side output bias current $I_{ob}^+$ flows through the PMOS transistors 213, 215, the output current $I_{out}^+$ flows into the output capacitor 209 and the current through the NMOS transistor 211 is referred to as $I_{oc}^+$.

In a similar manner for the negative side, the supply voltage $V_{dd}$ is provided to the collector terminal of another bipolar transistor 221, which has its emitter terminal coupled to the inverting input terminal of an opamp 223. The non-inverting input terminal of the opamp 223 receives a common mode input voltage signal $V_{cm1}+V_{in}^-$ (the negative common mode input voltage), and the output terminal of the opamp 223 drives the base terminal of the transistor 221. The emitter terminal of the transistor 221, referred to as node B, is coupled to a negative input of the CMFB 204.

Node B is coupled to one terminal of a second transconductor resistor $R_{T2}$ and to one terminal of a second series resistor $R_{S2}$. The resistance values of the resistors $R_{T1}$ and $R_{T2}$ are approximately equal to each other. Likewise, the resistance values of the resistors $R_{S1}$ and $R_{S2}$ are approximately equal to each other. The other terminal of the resistor $R_{S2}$ is provided to a negative input terminal (I−) of the tuning circuit 205. The other terminal of the resistor $R_{T2}$ is coupled to a negative output port or terminal (O−) of the tuning circuit 205, which is referred to as node D. Node D is also coupled to an input terminal of a second current source 227, which has its other terminal coupled to ground. The current source 227 sinks a constant current of $I_{bias1}$ in a similar manner as the current source 207. Node D is further coupled to an inverting input terminal of an opamp 229, which receives the bias voltage $V_{b1}$ at its non-inverting input terminal. The output terminal of the opamp 229 is coupled to the gate of another NMOS transistor 231, which has its source terminal coupled to node D.

The source voltage $V_{dd}$ is coupled to the source terminal of a PMOS transistor 233, which receives the $V_{cmfb}$ signal at its gate. The drain terminal of the PMOS transistor 233, referred to as node F, is coupled to the source terminal of another PMOS transistor 235, which receives the bias voltage $V_{b2}$ at its gate. The drain terminal of the PMOS transistor 235 is coupled to the positive terminal of a second output capacitor 237 and to the drain terminal of the NMOS transistor 231. The negative terminal of the capacitor 237 is coupled to ground. The positive terminal of the capacitor 237 is the negative output terminal $V_{out}^{31}$ of the transconductor block 200. A negative side output bias current $I_{ob}^{31}$ flows through the PMOS transistors 233, 235, the output current $I_{out}^-$ flows into the output capacitor 237 and the current through the NMOS transistor 229 is referred to as $I_{oc}^-$.

The transconductor block 200 operates in a similar manner as described above for the transconductor block 100, except in differential mode. The $V_{cm}$ signal sets the primary common mode voltage for the transconductor block 200 and optionally for the overall circuit in which it is used as a building block. The $V_{cm}$ signal is set to a level that ensures maximal voltage swing and linearity. In one embodiment in which the supply voltage $V_{dd}$ is 3 volts, for example, then the Vcm voltage may be set to approximately 1.5 volts. The CMFB 204 asserts the $V_{cmfb}$ signal in a feedback manner to maintain $V_{cm1}$ approximately equal to $V_{cm}$, since $V_{cm1}$ otherwise tends to drift over time. The opamps 203 and 223 and the transistors 201, 221 act as a voltage follower amplifier to apply the AC input signal ($V_{cm1}+V_{in}^+$, $V_{cm1}+V_{in}^-$) directly across the nodes A and B, which forms a differential input of a tunable transconductive device comprising the resistors RT1, RS1, RS2 and RT2 and the tuning circuit 205.

$R_{T1}$, and $R_{T2}$ are the main transconductance setting elements. The tuning circuit 205 is adjusted in a similar manner as the TC 109 by applying an adjust voltage across $V_A$ and $V_C$ to precisely define the primary transconductance characteristic of the transconductor block 200 to help compensate for manufacturing variations. Also, since the quiescent point is subject to change because of manufacturing variations and common mode fluctuations, in order to have a stable biasing point, the CMFB 204 asserts the $V_{b1}$ signal as a level shifted copy of the $V_{cm1}$ signal. This is achieved by a tight common mode control loop, which further ensures that the transconductor block 200 has stable DC biasing.

The opamps 209, 229 operate as high gain amplifiers to hold the voltages at nodes C and D to a constant value of $V_{b1}$. The current sources 207, 227 provide a constant bias current of $I_{bias1}$ for the input circuit. The $I_{ob}^+$ current in the output cascode stage formed by the PMOS transistors 213, 215 is effectively constant although adjustable via $V_{cmfb}$. Likewise, the $I_{ob}^-$ current in the output cascode stage formed by the PMOS transistors 233, 235 is effectively constant although adjustable via $V_{cmfb}$. Since $V_{b1}$ is fixed, the differential currents in the input stage $I_{in}^+=I_{in1}+I_{in2}$ and $I_{in}^-=I_{in3}+I_{in4}$ are dependent on the absolute value of the resistors $R_{T1}$ and $R_{T2}$, the series resistors $R_{S1}$, and $R_{S2}$, the common mode voltage $V_{cm1}$ and the tuning circuit 205. Since the current sources 207, 227 sink a constant current $I_{bias1}$ for both the positive and negative sides, the varying input current due to the input voltage flows into the output legs of the circuit. In particular, the opamp 209 controls the NMOS transistor 211 to sink an output current $I_{oc}^+$ that is based on the input current: $I_{oc}^+=I_{bias1}-(I_{in1}+I_{in2})$. Likewise, the opamp 229 controls the NMOS transistor 231 to sink an output current $I_{oc}^-$ that is based on the input current: $I_{oc}^-=I_{bias1}-(I_{in3}+I_{in4})$. The output current $I_{out}^+$ is $I_{out}^+=I_{ob}^+-I_{oc}^+$. The output current: $I_{out}$ is $I_{out}^-=I_{ob}^-−I_{oc}^-$. In this manner, the NMOS transistors 211, 231 operate as current control devices for controlling output currents $I_{oc}^+$, $I_{oc}^-$, respectively. In general, the opamps 209, 229 and the NMOS transistors 211, 231 form an amplifier circuit that maintains the output ports of the tunable transconductive device at the level of the bias signal $V_{b1}$ and that provides a differential output current that is based on the differential input signal.

The PMOS transistors 213, 215 and 233, 235 are each biased to operate in saturation mode. The $V_{cmfb}$ signal has a voltage level that keeps the PMOS transistors 213, 233 in saturation mode and that sets a desired DC level of $I_{ob}^+$ and $I_{ob}^-$. The $V_{b2}$ signal is set to operate the PMOS transistors 215, 235 in saturation mode, but does not otherwise effect the $I_{ob}^+$ and $I_{ob}^-$ signals. Thus, the PMOS transistors 213 and 215 and the PMOS transistors 233 and 235 form output current sources that provide output bias currents adjusted by the common mode feedback signal $V_{cmfb}$. Since the cascode circuits formed by the PMOS transistors 213, 215 and 233, 235 each source an approximately constant currents $I_{ob}^+$ and $I_{ob}^-$, respectively, the respective varying output currents $I_{out}^+$ and $I_{out}^-$ flow through the corresponding integration capacitors 217, 230. In this manner, an integrator is realized.

Figure 3:
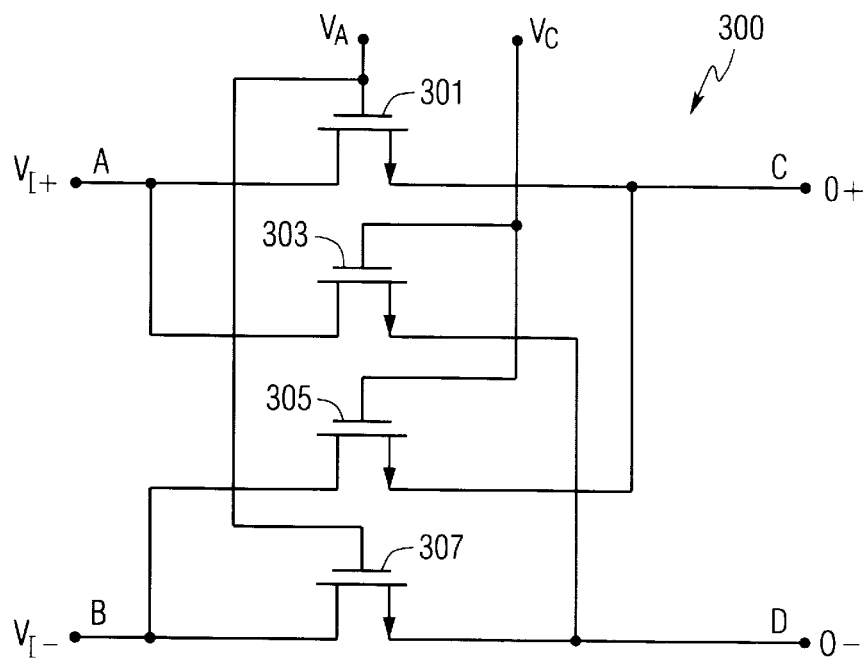
FIG. 3 is a circuit diagram of a Czarnul circuit, which is an exemplary embodiment of the tuning circuit of FIG. 2.

FIG. 3 is a circuit diagram of a Czarnul circuit 300, which is an exemplary embodiment of the tuning circuit 205. The positive input voltage $V_{I+}$(from $R_{S1}$) is provided to the drains of two NMOS transistors 301, 303. The negative input voltage $V_{1-}$ (from $R_{S2}$) is provided to the drains of two NMOS transistors 305, 307. The input adjust voltage $V_A$ is applied to the gate terminals of the NMOS transistors 301 and 307 and the input adjust voltage $V_C$ is applied to the gate terminals of the NMOS transistors 303 and 305. The source terminals of the NMOS transistors 301, 305 are coupled together to provide the positive output terminal O+, which is coupled to the C node of the transconductor block 200. The source terminals of the NMOS transistors 303, 307 are coupled together to provide the negative output terminal O−, which is coupled to the D node of the transconductor block 200.

The Czarnul circuit 300 has been utilized in opamp-based active MOSFET-C filters to improve linearity, but filters based on this technique are generally only useful for low frequency applications due to the finite gain bandwidth product of operational amplifiers. Here, the Czarnul circuit 300 is utilized in a transconductor implementation which ultimately provides filters at much higher bandwidth. The Czarnul circuit 300 circuit provides a very high degree of linearity for the transconductor block 200 by reducing or eliminating both even and odd order non-linearities. The NMOS transistors 301, 303, 305 and 307 (301–307) are matched. The Czarnul circuit 300 synthesizes a linear resistor of value $(2K \cdot (V_A - V_C))/2$, where the conduction factor $K = (\mu \cdot C_{ox} \cdot (W/L))/2$, where $\mu$ is mobility, where $C_{ox}$ is the oxide capacitance and where W/L is the aspect ratio of the NMOS transistors 301–307. The NMOS transistors 301, 303, 305 and 307 (301–307) are matched and have approximately equivalent aspect ratios.

The resistance value of the Czarnul circuit 300 does not depend on the threshold voltages $V_T$, the body effect terms ($\gamma$), or the substrate voltages $V_B$ of the NMOS transistors 301–307. The resistance of the Czarnul circuit 300 is tuned by the differential voltage $V_A - V_C$. Hence the common mode noise on the control lines, if any, are cancelled. Also the Czarnul circuit 300 has excellent current steering capability. The equivalent conductance is linearly controlled by the control voltage $V_A - V_C$. Since the resistance value does not depend on the substrate voltage $V_B$, the substrate parasitic signals do not modulate the resistance value.

There are some design considerations for using the Czarnul circuit 300. It is desired that the input voltage swing be balanced or approximately equal to a constant. This is achieved since the input voltage ($V_{cm1} + V_{in}^+$, $V_{cm1} + V_{in}^-$) of the transconductance circuit 200 is balanced around the common mode voltage $V_{cm1}$. It is desired that the voltage at the source terminals of the NMOS transistors 301–307 be held at a constant voltage. This is achieved by the opamps 209, 229 maintaining the voltage at nodes C and D at a constant voltage of $V_{b1}$. It is also desired to limit the swing of the NMOS transistors 301–307 to maintain operation in the linear range. For many communication filters, the cutoff frequency is fixed, so the filter should be able to tune out the manufacturing and temperature variations encountered in the integrated circuit (IC) process.

The Czarnul circuit 300, by itself, has a very wide tuning range. For the transconductor block 200, however, a reduced tuning range may be used, such as, for example, a tuning range of approximately 25%. Therefore, the series resistors $R_{S1}$, $R_{S2}$ are added to reduce the swing across the Czarnul circuit 300 and to place the NMOS transistors 301–307 further in the linear region to enhance linearity. The resistance of the series resistors $R_{S1}$, $R_{S2}$ are equal and chosen to achieve a tuning range of approximately 25% in the exemplary embodiment. Of course, any resistance value may be used to achieve any desired tradeoff between linearity and tuning range.

Figure 4:
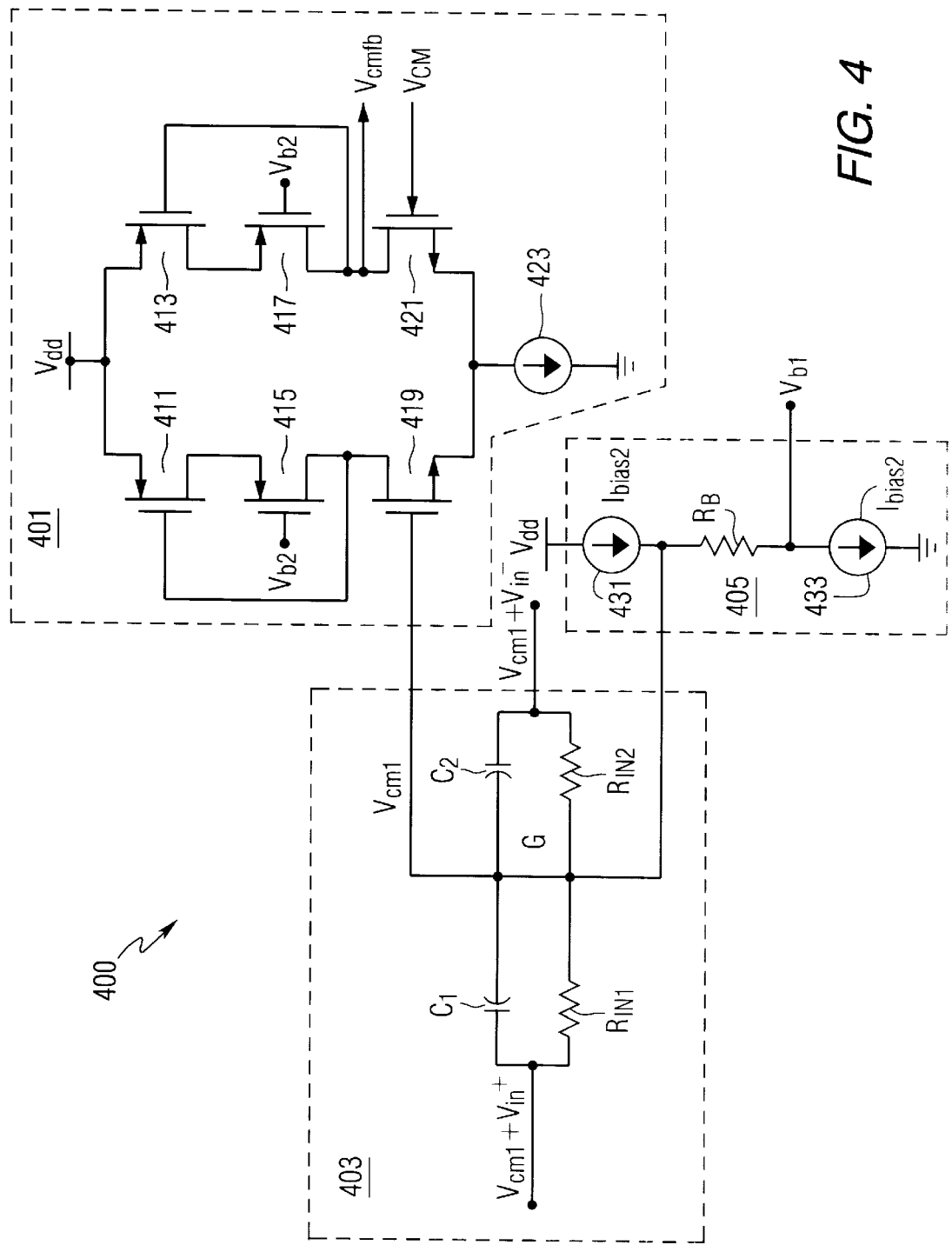
FIG. 4 is a circuit diagram of an exemplary common mode feedback circuit that may be used as the common mode feedback circuit of FIG. 2.

FIG. 4 is a circuit diagram of an exemplary common mode feedback circuit (CMFB) 400 that may be used as the CMFB 204. The CMFB 400 includes a differential amplifier stage 401, an input stage 403 and a bias signal stage or simply bias stage 405. The positive input voltage $V_{cm1} + V_{in}^+$ is provided to one terminal of a resistor $R_{IN1}$ and to the positive terminal of a compensation capacitor $C_{IN1}$ within the input stage 403. The other terminals of the resistor $R_{IN1}$ and the capacitor $C_{IN1}$ are coupled to a node G. The negative input voltage $V_{cm1} + V_{in}^-$ is provided to one terminal of a resistor $R_{IN2}$ and to the positive terminal of another compensation capacitor $C_{IN2}$. The other terminals of the resistor $R_{IN2}$ and the capacitor $C_{IN2}$ are coupled to node G. The resistors $R_{IN1}$ and $R_{IN2}$ are matched. The compensation capacitors $C_{IN1}$ and $C_{IN2}$ may be matched, although this is not required. The balanced configuration of the RC circuit of the input stage 403 causes the input common mode signal or voltage $V_{cm1}$ to develop at node G.

Resistors are used instead of MOSFETs to achieve the common mode voltage $V_{cm1}$. The CMFB 400 exhibits high linearity and stabilizes the DC operating point and biases the transconductance circuit 200. The capacitors $C_{IN1}$ and $C_{IN2}$ are used as the compensating capacitors and essentially they introduce a zero. This helps maintain a high phase margin for the common mode loop.

In the differential amplifier stage 401, the supply voltage $V_{dd}$ is applied to the source terminals of two PMOS transistors 411 and 413. The drain terminal of the PMOS transistor 411 is coupled to the source terminal of a PMOS transistor 415 and the drain terminal of the PMOS transistor 413 is coupled to the source terminal of another PMOS transistor 417. The drain terminal of the PMOS transistor 415 is coupled to the drain terminal of a NMOS transistor 419 and the drain terminal of the PMOS transistor 417 is coupled to the drain terminal of another NMOS transistor 421. The source terminals of the NMOS transistors 419, 421 are coupled to an input of a constant current source 423, having its output coupled to ground. The gate terminal of the PMOS transistor 411 is coupled to the drain terminal of the PMOS transistor 415, and the gate terminal of the PMOS transistor 413 is coupled to the drain terminal of the PMOS transistor 417. The gate terminals of the PMOS transistors 415, 417 each receive the bias signal $V_{b2}$. The drain terminals of the transistors 417, 421 provide the common mode feedback voltage $V_{cmfb}$. The reference common mode signal $V_{cm}$ is applied to the gate terminal of the NMOS transistor 421. The $V_{cm1}$ signal from node G of the input stage 403 is provided to the gate terminal of the NMOS transistor 419.

The differential amplifier stage 401 operates to assert the $V_{cmfb}$ signal to maintain the $V_{cm1}$ signal as close as possible to the $V_{cm}$ signal. As noted previously, the transconductor block 200 is used as a building block for filters, amplifiers, etc., in which a plurality of transconductor blocks are inter-coupled together. A CMFB circuit is thus coupled to both inputs and outputs of respective transconductor blocks. As the $V_{cm1}$ signal tends to drift below (or above) the $V_{cm}$ signal, the $V_{cmfb}$ signal is asserted lower (or higher) to change the common mode signal at the output. In the overall circuit design, this tends to increase (or decrease) the $V_{cm1}$ signal towards the $V_{cm}$ signal.

Node G is coupled to the output of a current source 431 and to one terminal of a bias resistor $R_B$ within the bias voltage stage 405. The input of the current source 431 is coupled to receive the supply voltage $V_{dd}$. The other terminal of the resistor $R_B$ is coupled to the input of another current source 433, which has its output coupled to ground. The current sources 431, 433 source and sink the same current level $I_{bias2}$ through the bias resistor $R_B$. The junction between the current source 431 and the resistor $R_B$ is maintained at the $V_{cm1}$ signal. The junction between the current source 433 and the resistor $R_B$ provides the $V_{b1}$ bias signal. In this manner, the $V_{b1}$ bias signal is maintained at a level shifted version of the $V_{cm1}$ signal to reduce the effect of any noise and to increase linearity.

A tight common mode control is achieved by having two common mode loops in the CMFB 400. The lower loop formed by the bias voltage stage 405 including the resistor $R_B$, fixes the voltage $V_{b1}$ as a level shifted version of the input common mode voltage $V_{cm1}$. In one embodiment, the current $I_{bias2}$ of the current sources 431, 433 is derived from a resistor, where $I_{bias2} = V_{control}/R_{bias}$ (not shown). In a typical IC process, the ratio of resistors can be maintained with a very high accuracy. In the embodiment shown, $V_{control}$ may be implemented using a constant silicon bandgap voltage, which is a very accurate method. In that case, the drop across resistor $R_B = V_{control} \cdot R_B/R_{bias}$ and can be controlled very tightly. The voltage drop across resistor $R_B$ establishes the bias voltage $V_{b1}$, which fixes the current in the input leg of the transconductor block 200 ($I_{in1}+I_{in2}$, $I_{in3}+I_{in4}$) via the opamps 209, 229.

At the same time, the differential amplifier stage 401 controls the conmnon mode voltage of the output of the transconductor block 200, where the DC current in the output leg of the transconductor block 200 ($I_{ob}^+$ and $I_{ob}^-$) is fixed by the voltage $V_{cmfb}$. Both the loops of the CMFB 400 ensure that there is a very strong common mode control in the complete circuit. Almost all circuits in corresponding integrated circuits (ICs) are biased with a current source. In this case, the common mode control circuit is used in a manner that provides a stable biasing for the complete circuit.

Referring back to FIG. 2, the Czarnul circuit 300 is the core tuning block for the transconductor block 200. The conditions for the Czarnul circuit 300 are naturally satisfied since the nodes C and D are connected to opamp inputs which, due to negative feedback, forces these two points to be maintained at the same potential. The transconductor block 200 circuit exhibits excellent high frequency characteristics. The integrator output node forms the dominant pole. The other non-dominant poles, at nodes A, D and E are at very high frequencies. The impedance at nodes A and C is $1/(A_0 \cdot g_m)$, where $A_0$ is the open loop gain of the opamps 209, 229 at the signal frequency and $g_m$ is the transconductance of the transistor (BJT for node A and FET for node C). The resistance at node B is $1/g_m$. Hence the parasitic poles are at a very high frequency. It is noted that there are no PMOS transistors in the signal path. PMOS transistors are undesirable in the signal path since they have lower mobility. The transconductor core can very easily be used even for frequencies up to 50 Megahertz (MHz) without any deterioration in the performance.

It is noted that operation of the transconductor block 200 is relatively independent of the level of bias currents. A high degree of linearity is achievable at relatively low voltages and current levels. In this manner, ultra high linearity is achieved at relatively low power levels. Furthermore, the input and output are at relatively high impedance levels thereby eliminating any need for multistage amplifiers. Since the opamps 203, 223, 209 and 229 are operated at relatively low power and high impedance, they may also be operated at higher frequencies than are typically allowed for prior transconductor circuits. In this manner, a transconductor implemented according to the present invention provides relatively high linearity at higher frequencies, such as up to 50 MHz, and at relatively low power levels. A transconductor implemented according to the present invention, therefore, has utility for a wide range of applications including portable or hand-held communication devices, such as cell phones, pagers, personal digital assistants (PDAs), etc.

Figure 5:
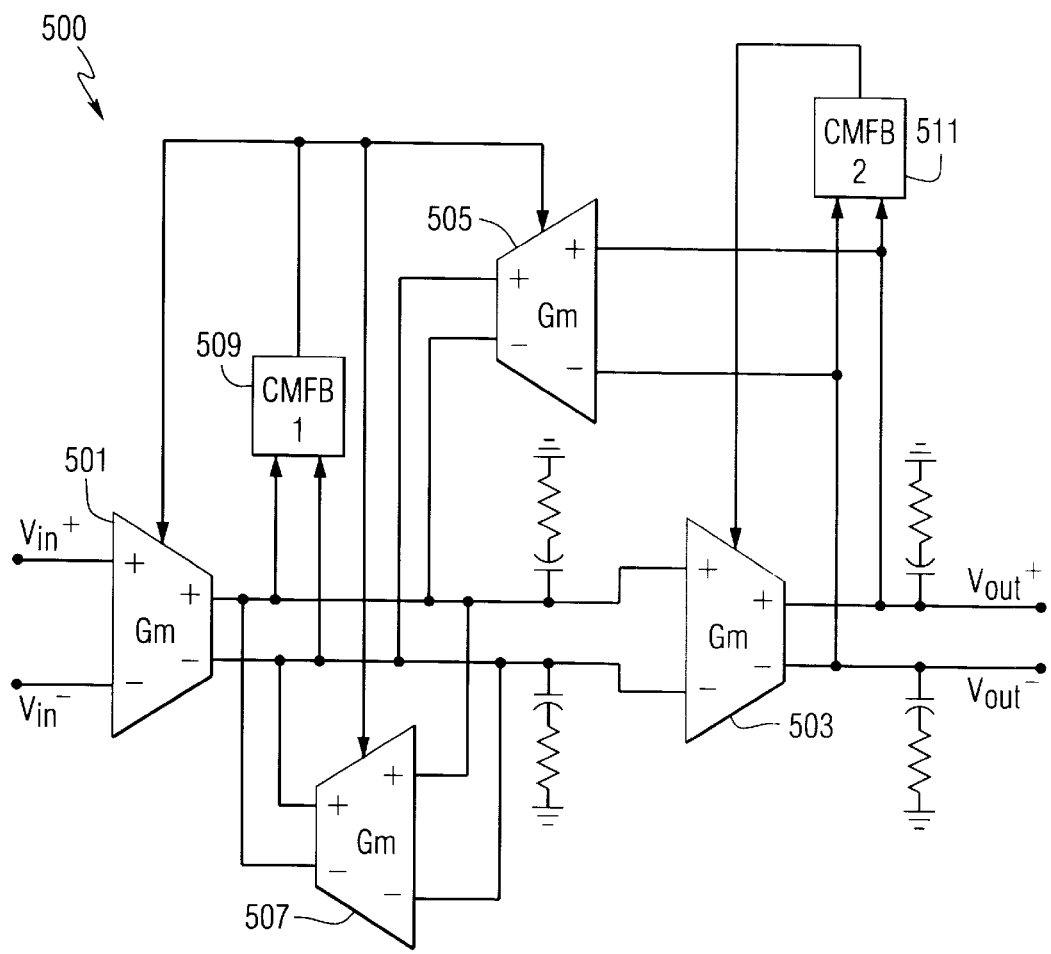
FIG. 5 is a block diagram of a second order biquad filter using transconductor blocks implemented according to embodiments of the present invention.

FIG. 5 is a block diagram of a second order biquad filter 500 using transconductor blocks 501, 503, 505 and 507 (501–507) as building blocks. The transconductor blocks 501–507 each have a transconductance denoted Gm and are each implemented in a similar manner as the transconductor block 200, except that only two CMFBs 509 and 511 are included for the transconductor blocks 501–507. A differential input is provided to the transconductor block 501, having its differential output coupled to the differential input of the transconductor block 503. The differential output of the transconductor block 503 is coupled to the differential input of the transconductor block 505, which has its differential output coupled to the differential input of the transconductor block 503. The differential input and output of the transconductor block 507 is coupled to the differential input of the transconductor block 503. The CMFB 509 has its differential input coupled to the differential output of the transconductor block 505, and provides its reference voltages (common mode and bias) to each of the transconductor blocks 501, 505 and 507. The CMFB 511 has its differential input coupled to the differential output of the transconductor block 503, and provides its reference voltages (common mode and bias) to the transconductor block 503.

The filter 500 has a tunability of approximately 25%. The filter 500 may be tunable over a higher frequency range, although at the possible expense of linearity. Differential load capacitors are not used because the load capacitors also form the dominant pole for the common mode feedback loop (CMFB). There is one CMFB for each node in the filter. The CMFB circuits 509, 511 have different loop gains. The CMFB 509 has more loop gain that the CMFB 511 since the feedback is through three transconductor blocks.

Figure 6:
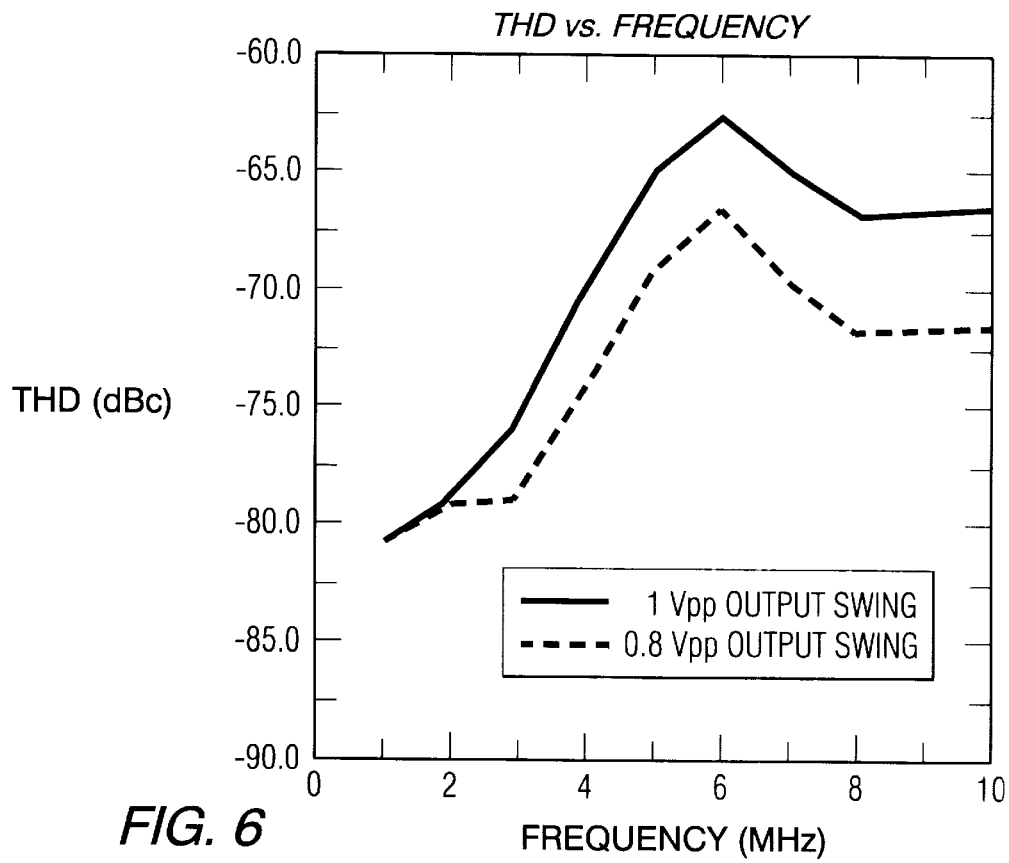
FIG. 6 is a graphic diagram showing total harmonic distortion as a function of frequency of the filter of FIG. 5 for two different voltage swings.

In one embodiment, the filter 500 has a quality factor of 1.4 and a cut-off frequency of approximately 22 MHz. The filter 500 is tunable in the range of 18.5 MHz to 24 MHz. The filter 500 maintains a total harmonic distortion (THD) of less than −60 dBc over the complete tuning range. FIG. 6 is a graphic diagram showing THD as a function of frequency of the filter 500 for two different voltage swings. A first voltage swing of 1 Volt peak to peak (Vpp) and a second voltage swing of 0.8 Vpp were measured. The total root mean square (rms) noise referred to the input is 100 nanovolts (nV) per square root of frequency in Hz. Two tone tests were less than 65 dBc over the entire band. The power consumption is as low as 6 mW per pole. Thus, a relatively high linearity is achieved at moderate power consumption and at relatively high frequency. A summary of the results are presented in the following Table I:

TABLE I

| Simulation Results of the biquad filter 500 | |
|---|---|
| Power Supply Voltage (Volts) | 3 |
| Power Consumption per Pole (mW) | 6 |
| 3 dB cutoff frequency (MHz) | 22 |
| Tuning Range (MHz) | −5 |
| Input Referred Noise (nV/Hz$^{1/2}$) | 100 |
| THD @ $V_{out}$ = 1 Vpp (dBc) | <−60 |
| IM3 @ $V_{in}^+$ = $V_{in}^-$ = 0.5 Vp (dBc) | <−60 |

Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A transconductor, comprising:

a tunable transconductive device having a differential input and a two port output;

a first amplifier circuit, receiving a differential input signal including an input signal combined with a common mode signal, that applies the differential input signal to the differential input of the tunable transconductive device;

a common mode circuit, receiving the differential input signal and receiving a reference common mode signal, that provides a bias signal and a common mode feedback signal;

an input current source, coupled to the two port output of the tunable transconductive device, that provides a constant input bias current;

first and second output current sources, each coupled to the common mode circuit, that provide output bias currents adjusted by the common mode feedback signal; and a second amplifier circuit, coupled to the common mode circuit, the input current source, the tunable transconductive device and to the first and second output current sources, that maintains the two port output of the tunable transconductive device at a level of the bias signal and that provides a differential output current based on the differential input signal.

2. The transconductor of claim 1, the tunable transconductive device comprising:

first and second transconductive resistors; and a tuning circuit in parallel with the first and second transconductive resistors.

3. The transconductor of claim 2, the tuning circuit having an adjust input for receiving an adjust signal.

4. The transconductor of claim 2, wherein the tuning circuit comprises a Czarnul tuning circuit.

5. The transconductor of claim 4, further comprising:

first and second series resistors, each coupled in series with a respective differential input of the Czarnul tuning circuit, the series resistors and the Czarnul tuning circuit coupled in parallel with the first and second transconductive resistors.

6. The transconductor of claim 1, the first amplifier circuit comprising:

first and second operational amplifiers, each including a non-inverting input that receives the common mode input signal, an inverting input and an output; and first and second bipolar transistors, each having a collector coupled to a supply voltage, an emitter coupled to an inverting input of a respective one of the first and second operational amplifiers, and a base coupled to an output of a respective one of the first and second operational amplifiers.

7. The transconductor of claim 1, the common mode circuit further comprising:

an input stage;

a bias signal stage; and a differential amplifier stage.

8. The transconductor of claim 7, the input stage comprising a balanced RC circuit that receives the differential input signal and that derives the common mode signal.

9. The transconductor of claim 7, the differential amplifier stage receiving the common mode signal from the input stage and the reference common mode signal and that provides the common mode feedback signal.

10. The transconductor of claim 7, the bias signal stage receiving the common mode signal from the input stage and that generates the bias signal based on the common mode signal.

11. The transconductor of claim 10, the bias signal stage comprising:

a bias resistor receiving the common mode signal on one side and providing the bias signal on its other side; and first and second bias current sources coupled on either side of the bias resistor.

12. The transconductor of claim 11, the first and second bias current sources each comprising:

a bandgap voltage source providing a precise control voltage; and a second bias resistor.

13. The transconductor of claim 1, the first and second output current sources each comprising MOSFETs coupled in a cascode configuration and operating in saturation.

14. The transconductor of claim 1, the second amplifier circuit comprising first and second high gain amplifiers, each having a first input receiving the bias signal and a second input coupled to a respective output port of the tunable transconductive device.

15. The transconductor of claim 14, the second amplifier circuit further comprising:

first and second current control devices, each having a current control path coupled to a respective one of the first and second output current sources and a control input coupled to an output of a respective one of the high gain amplifiers.

16. The transconductor of claim 15, the second amplifier circuit further comprising:

the first and second high gain amplifiers comprising first and second operational amplifiers, each including an inverting input coupled to a respective output port of the tunable transconductive device and a non-inverting input that receives the bias signal; and first and second MOSFETs, each having a current path coupled between a respective one of the first and second output current sources and to an inverting input of a respective one of the first and second operational amplifiers.

17. The transconductor of claim 1, including first and second output capacitors, each coupled at a junction between a respective one of the first and second output current sources and the second amplifier circuit, that provides an output voltage proportional to the integral of the differential input signal.

18. A transconductor, comprising:

a tunable resistive device having an input and an output;

a voltage follower amplifier, receiving a common mode input signal including an input signal combined with a common mode voltage, that provides the common mode input signal to the input of the tunable resistive device;

a common mode circuit, receiving a reference common mode voltage and the common mode input signal, that generates a bias voltage and a common mode feedback voltage;

an input current source, coupled to the output of the tunable resistive device, that sinks a constant bias current;

an adjustable output current source that receives the common mode feedback voltage and that provides a DC output current based on the common mode feedback voltage;

a variable current source, coupled to the output current source, that sinks current based on a control input; and a high gain amplifier, coupled to the output of the tunable resistive device and to the control input of the variable current source and that receives the bias voltage, that maintains the output of the resistive device at the bias voltage and that controls the variable current source to sink output current based on the input signal.

19. The transconductor of claim 18, the tunable resistive device comprising:

a Czarnul tuning circuit having an adjust input;

a series resistor coupled in series with the Czarnul tuning circuit; and a transconductance resistor coupled in parallel with the series resistor and the Czarnul tuning circuit.

20. The transconductor of claim 18, the voltage follower amplifier comprising:

an operational amplifier including a non-inverting input that receives the common mode input signal, an inverting input and an output; and a bipolar transistor having a collector coupled to a supply voltage, an emitter coupled to the inverting input of the operational amplifier and a base coupled to the output of the operational amplifier.

21. The transconductor of claim 18, the common mode circuit further comprising:

an input stage;

a bias voltage stage; and a differential amplifier stage.

22. The transconductor of claim 21, the input stage comprising a balanced RC circuit that receives the common mode input signal and that provides the common mode voltage.

23. The transconductor of claim 21, the differential amplifier stage receiving the common mode voltage from the input stage and the reference common mode voltage and that provides the common mode feedback signal.

24. The transconductor of claim 21, the bias voltage stage comprising:

a bias resistor receiving the common mode voltage from the input stage on one side and providing the bias voltage on its other side; and first and second constant current sources coupled on either side of the bias resistor.

25. The transconductor of claim 24, the first and second constant current sources each comprising:

a bandgap voltage source providing a precise control voltage; and a second bias resistor.

26. The transconductor of claim 18, the output current source comprising a first PMOS transistor having a gate terminal receiving the common mode feedback signal.

27. The transconductor of claim 26, the output current source further comprising:

a second PMOS transistor;

the first and second PMOS transistors coupled in cascode configuration and operating in saturation.

28. The transconductor of claim 18, the variable current source comprising an NMOS transistor having a gate terminal coupled to the output of the high gain amplifier.

29. The transconductor of claim 28, the high gain amplifier comprising an operational amplifier including an inverting input coupled to output of the tunable resistive device, a non-inverting input that receives the bias voltage and an output that drives the NMOS transistor to sink a current based on the input signal.

30. The transconductor of claim 18, having an output capacitor coupled at a junction between the output current source and the variable current source, that provides an output voltage proportional to an integral of the input signal.

31. A filter circuit, comprising:

one or more common mode circuits, each receiving a differential input signal with a common mode signal and receiving a reference common mode signal, and each providing a bias signal and a common mode feedback signal;

a plurality of intercoupled transconductors, each associated with one of the one or more common mode circuits, and each transconductor comprising:

a tunable transconductive device having a differential input, an adjust input voltage and a two port output, the transconductive device including a Czarnul tuning circuit coupled in parallel with a resistor;

a first amplifier circuit that applies a differential input signal with a common mode signal to the differential input of the tunable transconductive device;

an input current source, coupled to the two port output of the tunable transconductive device, that provides a constant input bias current;

first and second output current sources, each coupled to an associated common mode circuit, that each provide an output bias current adjusted by a common mode feedback signal; and a high gain amplifier, coupled to an associated common mode circuit, the transconductive device and to the first and second output current sources, that applies a bias signal to the output ports of the tunable transconductive device and that provides a differential output current based on the differential input signal; and a reference circuit that provides the reference common mode signal and an adjust input voltage for a tunable transconductive device of each transconductor.

32. The filter circuit of claim 31 being implemented on an integrated circuit.

* * * * *